United States Patent [19]

Lew

[11] Patent Number: 4,835,436
[45] Date of Patent: May 30, 1989

[54] PIEZOELECTRIC IMPULSE SENSOR

[76] Inventor: Hyok S. Lew, 7890 Oak St., Arvada, Colo. 80005

[21] Appl. No.: 170,992

[22] Filed: Mar. 21, 1988

[51] Int. Cl.$^4$ .......................................... H01L 41/08
[52] U.S. Cl. .................................... 310/338; 310/319; 310/329; 310/365; 73/861.22
[58] Field of Search ............... 310/328, 338, 339, 366, 310/357–359, 329, 365; 73/715, 717, 723, 754, 861.22, 861.24, DIG. 4, 661, 650

[56] References Cited

U.S. PATENT DOCUMENTS

| | | | |
|---|---|---|---|
| 2,894,317 | 7/1959 | Marks | 310/338 X |
| 3,349,259 | 10/1967 | Kistler | 310/338 |
| 3,495,102 | 2/1970 | List et al. | 310/338 |
| 3,566,163 | 2/1971 | Fischer et al. | 310/338 X |
| 3,582,691 | 6/1971 | Sonderegger et al. | 310/338 X |
| 4,262,544 | 4/1981 | Herzl | 310/338 X |
| 4,559,832 | 12/1985 | Burlage et al. | 73/861.24 |
| 4,604,544 | 8/1986 | Konomi et al. | 310/338 |

FOREIGN PATENT DOCUMENTS 0979919 12/1982 U.S.S.R. .................. 310/338

Primary Examiner—Mark O. Budd

[57] ABSTRACT

An impulse sensor comprises a first Piezo electric disc (25) with two oppositely polarized halves disposed symmetrically about a reference plane including the rib (26) of a thin wall of the transducer container vessel and pressed onto the thin wall, and a second Piezo electric disc (29) with the same polarization for both halves disposed symmetrically about the reference plane and pressed onto a rigid wall of the transducer container vessel. The impulses transversely acting on an impulse receiving member extending from the thin wall generate electric signals of high signal-to-noise ratio from the first Piezo electric disc (25) and electric signals of low signal-to-noise ratio from the second Piezo electric disc (29). The electric signals from the two Piezo electric discs are combined to cancel noises and extract refined signals representing the impulses.

11 Claims, 2 Drawing Sheets

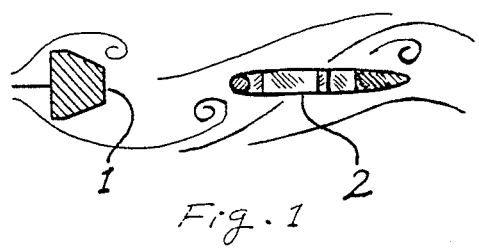
Fig. 1
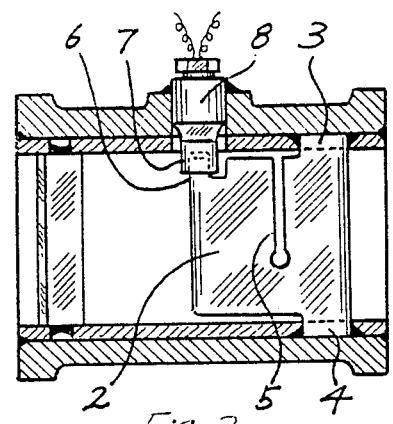
Fig. 2
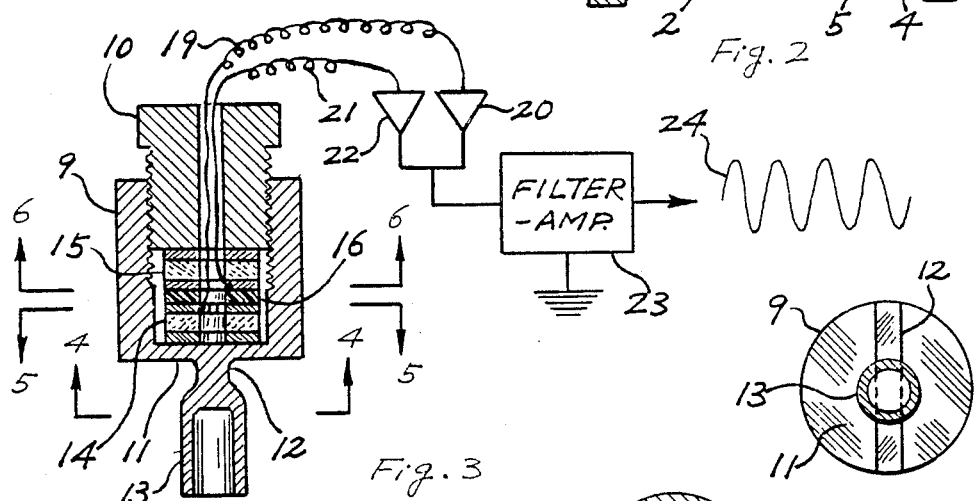
Fig. 3
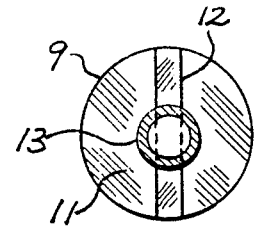
Fig. 4
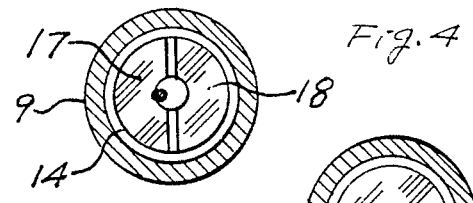
Fig. 5
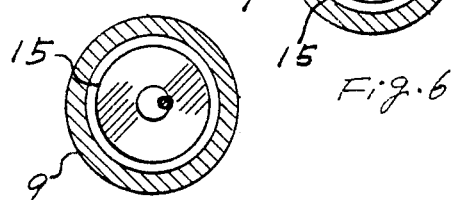
Fig. 6
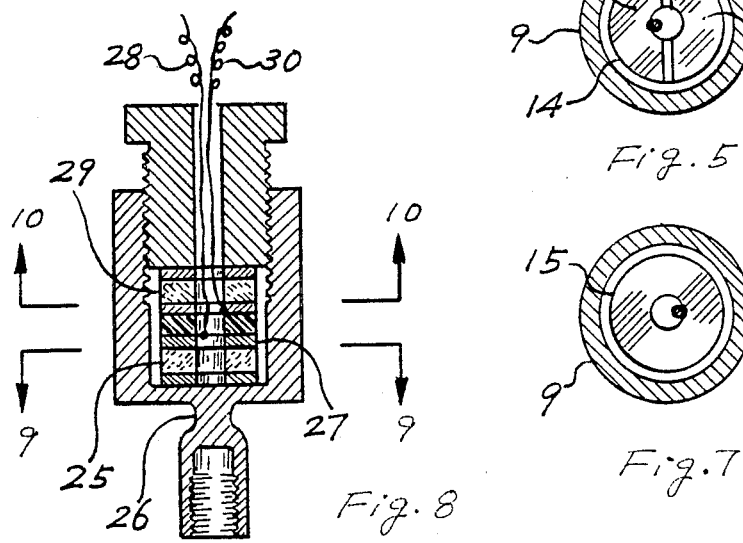
Fig. 7
Fig. 8

PIEZOELECTRIC IMPULSE SENSOR

In this decade, flow measurement technology has witnessed a number of remarkable progresses, as the new generation flowmeters such as the vortex shedding flowmeter, Coriolis force flowmeter and magnetic flowmeter have been developed and put into use in wide ranging industries. In spite of the new level of art brought forth by these flowmeters, there is little doubt that the present day versions of these new generation flowmeters are only primitive forms of new technologies yet to be perfected. For example, existing vortex shedding flowmeters have turn-down ratios (ratio of the maximum measurable velocity to the minimum measurable velocity) of 15 to 1 for average types and 20 to 1 for better versions. The vortex shedding flowmeters illustrated in the drawing of this patent application, which have been invented by this inventor, have a turn-down ratio of 60 to 1 when the noise level in the flow system is kept at the minimum. When these vortex shedding flowmeters are equipped with a highly effective noise canceling transducer, this high turn-down ratio of 60 to 1 can be attained under actual operating conditions with a sizable noise level.

The priority of the present patent application is based on a U.S. patent application Ser. No. 07/031,901 entitled "Impulse Sensor with Mechanical Preamplification" filed on Mar. 30, 1987.

The primary object of the present invention is to provide an impulse sensor comprising a mechanical preamplification means that selectively amplifies the mechanical impulses transmitted to the transducer element.

Another object is to provide an impulse sensor comprising a noise cancelling means, which cancels noise and extracts refined signals by combining two signals respectively generated by a first Piezo electric element with high signal to noise ratio and a second Piezo electric element with low signal to noise ratio.

A further object is to provide an impulse sensor comprising a first Piezo electric element with an electrode disposed asymmetrically with respect to a reference plane, which first Piezo electric element is disposed adjacent to and pressed onto a thin wall with a impulse receiving member extending therefrom, and a second Piezo electric element with an electrode disposed symmetrically with respect to the reference plane, which second Piezo electric element is disposed adjacent to and pressed onto the first Piezo electric element.

Yet another object is to provide another impulse sensor comprising a pair of Piezo electric elements with a common electrode polarized in two opposite directions and positioned opposite to one another about a reference plane, which pair of Piezo electric elements are disposed adjacent to and pressed onto a thin wall with an impulse receiving member extending therefrom, and a third Piezo electric element with an electrode disposed symmetrically with respect to the reference plane, which third Piezo electric element is disposed adjacent to and pressed onto the pair of Piezo electric elements.

Yet a further object is to provide an impulse sensor that detects impulses acting in any directions on a plane perpendicular to the impulse receiving member.

Still another object is to provide an impulse sensor compatible with high pressures as well as with very low and high temperatures.

These and other objects of the present invention will become clear as the description thereof progresses.

The present invention may be described with a great clarity and specificity by referring to the following figures:

FIG. 1 illustrates a cross section of an embodiment of the vortex shedding flowmeter employing the transducer of the present invention.

FIG. 2 illustrates another cross section of the vortex shedding flowmeter shown in FIG. 1.

FIG. 3 illustrates a cross section of an embodiment of the transducer usable in conjunction with a vortex shedding flowmeter.

FIG. 4 illustrates another cross section of the transducer shown in FIG. 3.

FIG. 5 illustrates a further cross section of the transducer shown in FIG. 3.

FIG. 6 illustrates yet another cross section of the transducer shown in FIG. 3.

FIG. 7 illustrates a cross section equivalent to that shown in FIG. 6.

FIG. 8 illustrates a cross section of another embodiment of the transducer usable in conjunction with a vortex shedding flowmeter.

Figure 9:
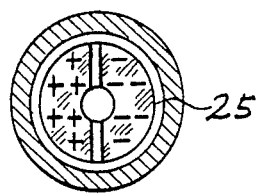
FIG. 9 illustrates another cross section of the transducer shown in FIG. 8.

In FIG. 1, there illustrated an arrangement of the fundamental components of a vortex shedding flowmeter employing a transducer of the present invention. The vortex generating bluff body 1 of an elongated cylindrical geometry is disposed across an upstream cross section of the flow passage, while the vortex sensing wing 2 of a planar geometry is disposed generally parallel to the bluff body 1 across a downstream cross section of the flow passage on a plan generally parallel to the central axis of the flow passage. The bluff body 1 produces a train of vortices shed from two sides thereof in an alternating pattern. These vortices create sinuating streamlines in the downstream region and, consequently, exert alternating lift forces on the wing sensor 2 which oscillates at the same frequency as the vortex shedding frequency. The vortex shedding frequency is linearly proportional to the fluid velocity in a wide velocity range. Consequently, the fluid velocity is determined from the vortex shedding frequency.

In FIG. 2, there is illustrated a cross section of an actual embodiment of the vortex shedding flowmeter operating on the principles described in conjunction with FIG. 1. The wing sensor 2 is secured to the wall of the flow passage at the two extremities 3 and 4 as the downstream portions thereof are fixedly anchored to the wall of the flow passage. A slit 5 partially extending from one extremity 3 towards the other extremity 4 of the wing sensor 2 provides an over-hanging structure for the upstream half of the wing sensor, wherein the free end 6 thereof is connected to an impulse receiving member 7 extending from a transducer container vessel 8 rigidly secured to the body structure of the flowmeter. The vortex shedding flowmeter of the construction shown in FIG. 2 has turn-down ratio of 60 to 1 under an ideal condition with a very low noise level, wherein it measures air velocity as low as 8 feet per second under the standard atmospheric conditions and water velocity as low as 0.5 feet per second. This extremely high turn-down ratio can be attained under actual operating conditions if the vortex shedding flowmeter is equipped with a transducer with highly effective noise cancelling means.

In FIG. 3 there is illustrated cross section of an embodiment of the transducer constructed in accordance with the principles of the present invention, that is usable in conjunction with the vortex shedding flowmeter such as those embodiments shown in FIGS. 2, 15, 16 and 17. This embodiment of the transducer comprises a container vessel 9 with a cavity sealed by a threaded plug 10, which has a thin end wall 11 with a reinforcing rib 12 and an impulse receiving member 13 extending therefrom. The extremity of the impulse receiving member has a coupling means for connecting it to an wing sensor such as the element 2 shown in FIG. 2. A first Piezo electric disc 14 with electrodes on both sides thereof is disposed within the cavity adjacent to the thin wall 11. A second Piezo electric disc 15 with electrodes on both sides is also disposed within the cavity intermediate the insulator disc 16 and the end face of the plug 10, wherein the stacked combination of the two Piezo electric discs 14 and 15, and the insulator disc 16 is compressed against the thin wall 11 by the threaded plug 10. It is preferred that the two Piezo electric discs 14 and 15, and the insulator disc 16 are circular discs of identical diameter having a circular hole at the center. The electrodes adjacent to the insulator disc 16 are electrically isolated from the metallic container vessel 9, while the electrodes respectively in contact with the thin wall 11 and the plug 10 are grounded through the metallic container vessel 9 and the metallic plug 10.

In FIG. 4 there is illustrated another cross section of the transducer shown in FIG. 3 taken along plane 4—4 as shown in FIG. 3. The rib 12 disposed across the thin end wall 11 and extending a short distance therefrom extends to the impulse receiving member 13.

In FIG. 5 there is illustrated a further cross section of the transducer shown in FIG. 3 taken along plane 5—5 as shown in FIG. 3. The electrodes of the first Piezo electric disc 14 adjacent to the insulator disc 16 comprise two semicircular halves 17 and 18 electrically isolated from one another, which are positioned opposite to one another about a plane including the rib 12. The electrodes of the first Piezo electric disc 14 in contact with the metallic thin wall 11 may be a single circular disc or two semicircular discs.

In FIG. 6 there is illustrated yet another cross section of the transducer shown in FIG. 3 taken along plane 6—6 as shown in FIG. 3. Each of the two electrodes of the second Piezo electric disc 15 adjacent to the insulator disc 16 must be disposed symmetrically about the plane including the rib 12 and, consequently, it must be split into two semicircular halves along a plane perpendicular to the plane including the rib, if these are split electrodes. The electrodes of the second Piezo electric disc 15 in contact with the end of the metallic plug 10 may be a single circular disc or two semicircular discs.

In FIG. 7 there is illustrated a cross section equivalent to that shown in FIG. 6. A circular electrode is axisymmetric and, consequently, it is always symmetric about the plane including the rib 12. Therefore, the split electrodes of the second Piezo electric disc 15 shown in FIG. 6 and the circular electrode shown in FIG. 7 are interchangeable.

The transducer illustrated in FIG. 3 measures impulses on the impulse receiving member 13 acting in directions perpendicular to the plane including the rib 12. A first wire or output means 19 extending from one of the two semicircular electrodes 17 and 18 of the first Piezo electric element 14 positioned opposite to one another about the plane including the rib 12 is connected to a first amplifier 20, while a second wire or output means 21 extending from the symmetric electrode of the second Piezo electric disc 15 is connected to a second amplifier 22. The signals from the two amplifiers 20 and 22 are fed to a filter-amplifier 23. An oscillatory impulse acting laterally on the impulse receiving member 13 in directions perpendicular to the plane including the rib 12 alternatively compresses the two semicircular halves of the first Piezo electric disc 14 divided by the plane including the rib 12. As a consequence, the two electrodes 17 and 18 generate alternating electromotive forces therebetween corresponding to the mechanical impulses. The two semicircular halves of the second Piezo electric disc 15 divided by a plane including the rib 12, which are alternatively compressed by the oscillatory impulse acting on the impulse receiving member 13, have a common symmetric electrode as shown in FIG. 6 or 7. The alternating electromotive forces generated between the two semicircular halves of the second Piezo electric disc 15 cancel themselves and, consequently, the symmetric electrode does not generate any net electromotive forces. Now it is clear that the impulse acting on the impulse receiving member generates electric signals from both of the asymmetric electrodes of the first Piezo electric disc 14 and nothing from the symmetric electrode of the second Piezo electric disc 15. A noise vibration exerting oscillatory compressive forces on the first and second Piezo electric discs 14 and 15 generates electric signals corresponding to the noise from all electrodes of the Piezo electric discs 14 and 15. Both of the asymmetric electrodes of the first Piezo electric disc 14 generate electric signals corresponding to the impulse and noise, while the symmetric electrode of the second Piezo electric disc 15 generates electric signals corresponding to the noise only. In actuality, due to imperfection in the geometry and electrical characteristics of the Piezo electric elements and electrodes, the symmetric electrode of the second Piezo electric disc 15 generates signals representing mostly noise and a small amount of impulses. Therefore, the electromotive forces $V_1$ and $V_2$ transmitted to the two amplifiers 20 and 22 respectively from the two Piezo electric discs 14 and 15 can be expressed by equations $$V_1 = S_1(\text{IMPULSE}) + N_1(\text{NOISE}), \quad (1)$$

$$V_2 = -s_1(\text{MPULSE}) - N_2(\text{NOISE}), \quad (2)$$

where $S_1$, $s_1$, $N_1$, and $N_2$ are constants intrinsic to each of the Piezo electric elements. The constants written in the capital and small characters respectively stand for numerically large and small constants. It can be easily shown that a pure noiseless signal can be obtained by adjusting the amplification factors $A_1$ and $A_2$ of the two amplifiers 20 and 22 in such a way that $$A_1 N_1 = A_2 N_2, \quad (3)$$

which yields the signal fed to filter-amplifier 23 given by equation $$A_1 S_1 (IMPULSE) = (A_1 V_1 - A_2 V_2)/(1 + A_2 s_2 / A_1 S_1). \quad (4)$$

The filter-amplifier 23 further conditions the impulse signals given by equation (4) and provide refined outputs 24 representing the impulse, which output has the same frequency as the vortex shedding frequency and amplitude proportional to the amplitude of the alternating lift forces on the wing sensor.

In FIG. 8 there is illustrated a cross section of another embodiment of the transducer constructed in accordance with the principles of the present invention, which embodiment has essentially the same packaging arrangement as the embodiment shown in FIG. 3. In this embodiment, the first Piezo electric disc 25 has two oppositely polarized semicircular halves positioned opposite to one another about a plane including the rib 26, wherein the two semicircular halves have a common circular electrode 27 connected to first output wire 28. The second Piezo electric disc 29 may have two oppositely polarized semicircular halves positioned opposite to one another about a plane perpendicular to the plane including the rib 26, and a split electrode, wherein one electrode symmetric about the plane including the rib 26 is connected to the output wire 30, or an identically polarized single circular disc having an circular electrode disposed axisymmetrically about the central axis of the impulse receiving member.

In FIG. 9 there is illustrated another cross section of the transducer shown in FIG. 8 taken along plane 9—9 as shown in FIG. 8. The first Piezo electric disc 25 with two oppositely polarized semicircular halves has a common circular electrode connected to the output wire 28.

Figure 10:
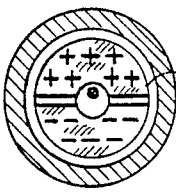
FIG. 10 illustrates a further cross section of the transducer shown in FIG. 8.

In FIG. 10 there is illustrated a further cross section of the transducer shown in FIG. 8 taken along plane 10—10 as shown in FIG. 8. The second Piezo electric disc 29 may have two oppositely polarized semicircular halves, wherein one of the two semicircular halves has an electrode symmetric about the plane including the rib 26, which is connected to the output wire 30 or it may have a identically polarized single disc as shown in FIG. 11.

Figure 11:
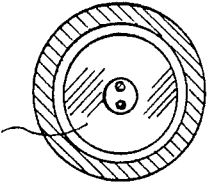
FIG. 11 illustrates a cross section equivalent to that shown in FIG. 10.

In FIG. 11 there is illustrated a cross section equivalent to that shown in FIG. 10, which shows an identically polarized single circular Piezo electric disc 31 with an electrode symmetric about the plane including the rib 26, that can be used in place of the split Piezo electric disc shown in FIG. 10.

It should be mentioned that, in theory the first Piezo electric disc 25 with two oppositely polarized halves and a common circular electrode should generate signals corresponding to the impulse only, as the signals corresponding to the noise cancel themselves, while the second Piezo electric disc 29 generates signals corresponding to noise only. In actuality, these two Piezo electric discs generate signals given by equations $$V_1 = S_1 (IMPULSE) + n_1 (NOISE), \quad (5)$$

$$V_2 = -s_2 (IMPULSE) - N_2 (NOISE), \quad (6)$$

where constants written in the capital and small characters respectively stands for numerically large and small constants. Following the same step which yielded equation (4), one can obtain the following equation from equations (5) and (6):

$$A_1 S_1 (IMPULSE) = (A_1 V_1 - a_2 V_2)/(1 + a_2 s_2 / A_1 S_1), \quad (7)$$

where $A_1$ and $a_2$ respectively stand for amplification factors of large and small values. According to equation (4) or (7), the maximum signal result when the asymmetric electrode of the first Piezo electric disc is combined with the symmetric electrode of the second Piezo electric disc or when a pair of antisymmetric Piezo electric discs with a common electrode is combined with a third Piezo electric disc with a symmetric electrode. However, the noise can be cancelled according to equations (4) or (7) as long as two Piezo electric discs with different asymmetry and symmetry, or with different antisymmetry and symmetry are employed.

Figure 12:
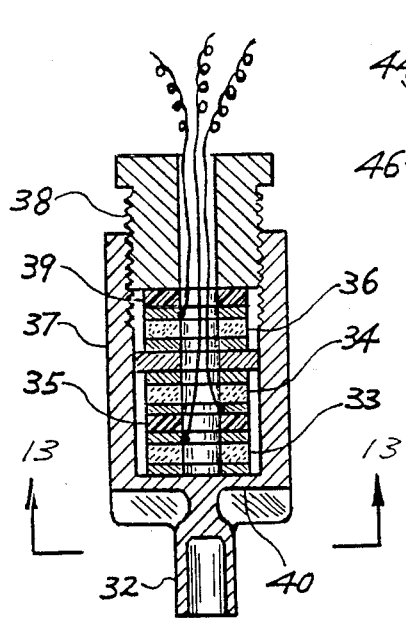
FIG. 12 illustrates a cross section of an embodiemnt of the transducer capable of detecting impulses acting in any directions on a plane.

In FIG. 12 there is illustrated a cross section of an embodiment of the transducer of the present invention, that is capable of detecting lateral impulses acting in any directions perpendicular to the impulse receiving member 32. This embodiment comprises a first and second Piezo electric discs 33 and 34 separated by an insulator disc 35 and a third Piezo electric disc 36 separated from the first two Piezo electric discs by a conductor disc 37 and from the plug 38 by an insulator disc 39, wherein the conductor disc 37 is in contact with the metallic container vessel wall. The combination of the first, second and third Piezo electric discs may comprise three Piezo electric discs shown in FIGS. 5, 6 and 7 in that order or those shown in FIGS. 9, 10 and 11 in that order. The first Piezo electric disc detects impulses in a first direction and the second Piezo electric disc detects impulses in a second direction perpendicular to the first direction, while the third Piezo electric disc detects noise. The signals from the first and third Piezo electric discs are combined to obtain the refined signals representing the impulses in the first direction, while the signals from the second and third Piezo electric discs are combined to obtain the refined signals representing the impulses in the second direction. The resultant value of the impulses are obtained by adding the impulses in the first and second directions in accordance with the Pythagorean theorem.

Figure 13:
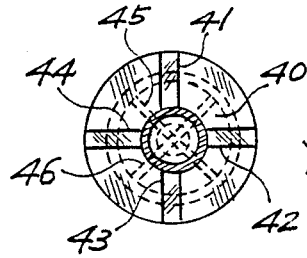
FIG. 13 illustrates another cross section of the transducer shown in FIG. 12.

In FIG. 13 there is illustrated another cross section of the transducer shown in FIG. 12 taken along plane 13—13 as shown in FIG. 12. The thin end wall 40 includes four reinforcing ribs 41, 42, 43 and 44 radiating from the impulse receiving member 32 in four othogonal directions, wherein the planes 45 and 46 defining the asymmetry and symmetry or the antisymmetry and symmetry of the Piezo electric elements and the electrodes thereof divide the angle between two adjacent ribs into two equal angles.

It should be mentioned that the transducers shown in FIG. 3 with two Piezo electric discs respectively shown in FIG. 5 and 6, and that shown in FIG. 8 with two Piezo electric discs respectively shown in FIGS. 9 and 10 also measure two orthogonal components of impulses, as each pair of the Piezo electric discs provide a two different combinations of the impulse detecting disc and noise detecting disc for two orthogonal directions. In other words, the third Piezo electric transducer disc 36 can be omitted from the combination shown in FIG. 12 without seriously compromising the performance thereof.

Figure 14:
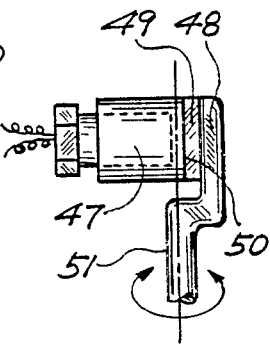
FIG. 14 illustrates a transducer of the present invention used as a torque sensor.

In FIG. 14 there is illustrated the transducer shown in FIG. 3 or 8 used as a torque sensor. The transducer 47 comprises an angled extension 48 affixed to the rib 49 included in the thin flange 50 wherein the angled extension 48 is connected to a torsion member 51 with the torsion axis generally coinciding with the thin flange 50.

Figure 15:
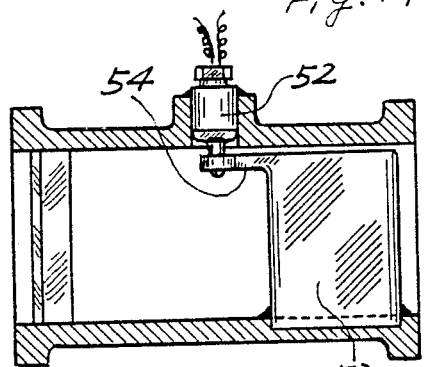
FIG. 15 illustrates another embodiment of the vortex shedding flowmeter employing the transducer of the present invention.

In FIG. 15 there is illustrated another embodiment of the vortex shedding flowmeter employing the transducer 52 of the present invention, wherein the wing sensor 53 with one extremity secured to the wall of the flow passage is connected to the impulse receiving member of the transducer 52 by an extendion 54 laterally extending from the other extremity of the wing sensor 53 and mechanically coupled to the impulse receiving member of the transducer 54. It should be mentioned that the other extremity of the wing sensor 53 may be coupled directly to the impulse receiving member of the transducer 52 without the laterally extending member 54.

Figure 16:
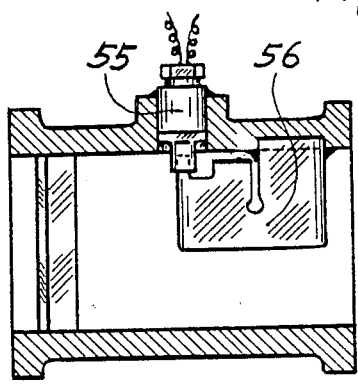
FIG. 16 illustrates a further embodiment of the vortex shedding flowmeter employing the transducer of the present invention.

In FIG. 16 there is illustrated a further embodiment of the vortex shedding flowmeter employing the transducer 55 of the present invention. The downstream half of the wing sensor 56 partially separated from the upstream half by a slit is secured to the flow passage at one extremity, wherein the same extremity of the upstream half is connected to the impulse receiving member of the transducer 55.

Figure 17:
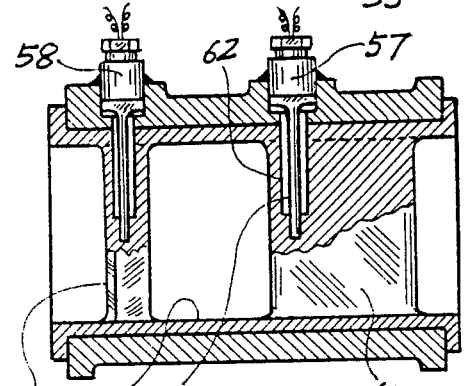
FIG. 17 illustrates yet another embodiment of the vortex shedding flowmeter employing the transducer of the present invention.

In FIG. 17 there is illustrated yet another embodiment of a vortex shedding flowmeter employing the transducer 57 or 58 of the present invention, which embodiment shows three different arrangements for measuring vortex signals in one illustration. The first arrangement comprises a plastic insertion sleeve 59 including a bluff body 60 and a wing sensor 61 built therein as integral structures, wherein the wing sensor 61 includes a blind hole 62 disposed therethrough following the leading edge of the wing sensor 61. The impulse receiving member 63 extending from the transducer 57 engages the blind hole 62 in a clearance relationship, wherein the extremity of the impulse receiving member 63 is anchored to the wing sensor 61 at a midsection thereof. In this combination of the bluff body 60 and the wing sensor 63 mechanically coupled to the transducer 57, the transducer 58 coupled to the bluff body is omitted as the vortices shed from the bluff body 60 are detected by the transducer 57 coupled to the wing sensor 61. The second arrangement comprises the embodiment shown in FIG. 17 minus the combination of the wing sensor 61 and the transducer 57. In this arrangement, the transducer 58 mechanically coupled to the bluff body 60 in the same manner as that described in conjunction with the combination of the transducer 57 and the wing sensor 61, detects the alternating lateral reaction forces exerted on the bluff body 60 by the vortices shed therefrom. Of course, the third arrangement is the combination that includes all of the elements shown, wherein electric signals from the two transducers are combined to cancel the noises and extract the vortex signals in a refined form.

While the principles of the present invention have now been made clear by the illustrative embodiments, there will be immediately obvious to those skilled in the art many modifications of the structures, arrangements, proportions, elements and materials which are particularly adapted to the specific working environments and operating conditions in the practice of the invention without departing from those principles. It is not desired to limit the inventions to the particular illustrated embodiments shown and described and, accordingly, all suitable modifications and equivalents may be resorted to falling within the scope of the inventions as defined by the claims which follow.

The embodiments of the inventions, in which an exclusive property or priviledge is claimed, are defined as follows:

1. An apparatus for detecting impulses and forces comprising in combination:
   (a) a container vessel including a cavity surrounded by a thin wall on one side and by rigid walls on other sides;
   (b) an impulse receiving member extending from said thin wall for receiving impulses and forces acting transversely thereto;
   (c) a first Piezo electric element disposed generally parallel to said thin wall within said cavity and pressed onto said thin wall, said first Piezo electric element including at least one electrode disposed asymmetrically with respect to a plane generally including the central axis of the impulse receiving member and generally perpendicular to said thin wall;
   (d) a second Piezo electric element disposed generally parallel to the first Piezo electric element within said cavity intermediate the first Piezo electric element and one of said rigid walls in a compressed arrangement, said second Piezo electric element including an electrode disposed generally symmetric with respect to said plane; and
   (e) at least two output means respectively connected to the asymmetrically disposed electrode of the first Piezo electric element and the symmetrically disposed electrode of the second Piezo electric element;

whereby electric signals from said two output means can be combined to cancel noises and extract refined signals representing the impulses.

2. The combination as set forth in claim 1 wherein said thin wall includes a reinforcing rib member disposed on said plane.

3. The combination as set forth in claim 1 wherein said thin wall includes four reinforcing rib member extending radially from the impulse receiving member in an axisymmetric pattern wherein said plane divides angle between a pair of adjacent rib members into two generally equal angles.

4. An apparatus for detecting impulses and forces comprising in combination:
   (a) a container vessel including a cavity surrounded by a thin wall on one side and by rigid walls on other sides;
   (b) an impulse receiving member extending from said thin wall for receiving impulses and force acting transversely thereto;
   (c) a pair of Piezo electric elements disposed generally parallel to said thin wall within said cavity and pressed onto said thin wall, said pair of Piezo electric elements polarized in two opposite directions and positioned opposite to one another about a first plane generally including the central axis of the impulse receiving member and generally perpendicular to said thin wall, wherein said pair of Piezo electric elements have electrodes electrically connected to one another;

(d) a third Piezo electric element disposed generally parallel to said pair of Piezo electric elements within said cavity intermediate said pair of Piezo electric elements and one of said rigid walls in a compressed arrangement, said third Piezo electric element including an electrode disposed generally symmetrically about said first plane; and (e) at least two output means respectively connected to the electrically connected electrodes of said pair of Piezo electric elements and the symmetrically disposed electrode of said third Piezo electric element;

whereby electric signals from said two output means can be combined to cancel noises and extract refined signals representing the impulses.

5. The combination as set forth in claim 1 wherein said thin wall includes a reinforcing rib member disposed on said first plane.

6. The combination as set forth in claim 2 wherein said combination includes a fourth Piezo electric element disposed on the same plane as said third Piezo electric element within said cavity intermediate said pair of Piezo electric elements and one of said rigid walls in a compressed arrangement, said third and fourth Piezo electric elements polarized in two opposite directions and positioned opposite to one another about a second plane generally including the central axis of the impulse receiving member and generally perpendicular to said first plane, wherein said fourth Piezo electric element has an electrode electrically connected to the electrode of said third Piezo electric element.

7. The combination as set forth in claim 6 wherein said thin wall includes four reinforcing rib members extending radially from the impulse receiving members in an exisymmetric pattern wherein said first plane divides angle between a pair of adjacent rib members into two generally equal angles.

8. An apparatus for detecting impulses and forces comprising in combination:
(a) a container vessel including a cavity surrounded by a thin wall on one side and by rigid walls on other sides;
(b) an impulse receiving member extending from said thin wall for receiving impulses and forces acting transversely thereto;
(c) a first Piezo electric element disposed generally parallel to said thin wall within said cavity and pressed onto said thin wall, said first Piezo electric element including an electrode disposed asymmetrically with respect to a first plane generally including the central axis of said impulse receiving member and generally perpendicular to said thin wall;
(d) a second Piezo electric element disposed generally parallel to said first Piezo electric element within said cavity and pressed onto said first Piezo electric element, said second Piezo electric element including an electrode disposed asymmetrically about a second plane generally including the central axis of the impulse receiving member and generally perpendicular to said first plane;
(e) a third Piezo electric element disposed generally parallel to said second Piezo electric element within said cavity intermediate said second Piezo electric element and one of said rigid walls in a compressed arrangement, said third Piezo electric element including an electrode disposed axisymmetrically about the central axis of the impulse receiving member; and
(f) at least three output means respectively connected to the asymmetrically disposed electrodes of said first and second Piezo electric elements and the axisymmetrically disposed electrode of said third Piezo electric element;

whereby electric signals from said three output means can be combined to cancel noises and extract refined signals representing the impulses.

9. The combination as set forth in claim 8 wherein said thin wall includes four reinforcing rib members radially extending from the impulse receiving member in an axisymmetric pattern wherein each of the four reinforcing rib members divides angle between said first and second planes into two generally equal angles.

10. An apparatus for detecting impulses and forces comprising in combination:
(a) a container vessel including a cavity surrounded by a thin wall on one side and by rigid walls on other sides;
(b) an impulse receiving member extending from said thin wall for receiving impulses and force acting transversely thereto;
(c) a first pair of Piezo electric elements disposed generally parallel to said thin wall within said cavity and pressed onto said thin wall, said first pair of Piezo electric elements polarized in two opposite directions and positioned opposite to one another about a first plane generally including the central axis of the impulse receiving member and generally perpendicular to said thin wall, said first pair of Piezo electric elements including electrodes electrically connected to one another;
(d) a second pair of Piezo electric elements disposed generally parallel to said first pair of Piezo electric elements within said cavity and pressed onto said first pair of Piezo electric elements, said second pair of Piezo electric elements polarized in two opposite directions and positioned opposite to one another about a second plane generally including the central axis of the impulse receiving member and generally perpendicular to said first plane, said second pair of Piezo electric elements including electrodes electrically connected to one another;
(e) a fifth Piezo electric element disposed generally parallel to said second pair of Piezo electric elements within said cavity intermediate said second pair of Piezo electric elements and one of said rigid walls in a compressed arrangement, said fifth Piezo electric element including an electrode disposed axisymmetrically about the central axis of the impulse receiving member; and
(f) at least three output means respectively connected to the electrically connected electrodes of said first and second pair of Piezo electric elements and the axisymmetrically disposed electrode of said fifth Piezo electric element;

whereby electric signals from said three output means can be combined to cancel noises and extract refined signals representing the impulses.

11. The combination as set forth in claim 9 wherein said thin wall includes four reinforcing rib members radially extending from the impulse receiving member in an axisymmetric pattern wherein each of the four reinforcing rib members divides angle between said first and second planes into two generally equal angles.

* * * * *